(12) United States Patent
Notake et al.

(10) Patent No.: US 7,109,095 B2
(45) Date of Patent: Sep. 19, 2006

(54) METHOD FOR FABRICATING SEMICONDUCTOR DEVICE

(75) Inventors: Hidenori Notake, Kyoto (JP); Teruhito Ohnishi, Osaka (JP); Akira Asai, Osaka (JP); Shigetaka Aoki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 132 days.

(21) Appl. No.: 10/396,505

(22) Filed: Mar. 26, 2003

(65) Prior Publication Data

US 2003/0186516 A1 Oct. 2, 2003

(30) Foreign Application Priority Data

Apr. 1, 2002 (JP) ............................. 2002-099163

(51) Int. Cl.
*H01L 21/20* (2006.01)

(52) U.S. Cl. ................ 438/478; 438/312; 438/694
(58) Field of Classification Search ................ 438/500, 438/507, 694, 718, 737, 752, 312, 478, 481
See application file for complete search history.

(56) References Cited

U.S. PATENT DOCUMENTS

| | | | |
|---|---|---|---|
| 5,389,799 A * | 2/1995 | Uemoto | 257/77 |
| 5,476,813 A * | 12/1995 | Naruse | 438/311 |
| 5,504,018 A | 4/1996 | Sato | |
| 5,668,022 A | 9/1997 | Cho et al. | |
| 5,705,830 A * | 1/1998 | Siergiej et al. | 257/77 |
| 5,800,949 A | 9/1998 | Edo et al. | |
| 5,809,103 A | 9/1998 | Smith et al. | |
| 5,846,676 A * | 12/1998 | Chiba et al. | 430/5 |
| 5,882,424 A | 3/1999 | Taylor et al. | |
| 6,153,010 A * | 11/2000 | Kiyoku et al. | 117/95 |
| 6,381,300 B1 * | 4/2002 | Ezaki | 378/35 |
| 6,566,158 B1 * | 5/2003 | Eriksen et al. | 438/53 |
| 6,756,278 B1 | 6/2004 | Yuki et al. | |

FOREIGN PATENT DOCUMENTS

| | | |
|---|---|---|
| CN | 1294414 A | 5/2001 |
| EP | 1 044 291 | 4/2003 |
| JP | 05335216 A * | 12/1993 |
| JP | 11-283892 | 10/1999 |
| WO | WO 02/097864 | 12/2002 |

OTHER PUBLICATIONS

Bensahel E. et al., "Front-end, single-wafer diffusion processing for advanced 300-mm fabrication lines", Microelectronic engineering, Elsevier Publishers B.V., Amsterdam, NL, vol. 56, No. 1-2, pp. 49-59, May 2001.

* cited by examiner

Primary Examiner—Tuan H. Nguyen
(74) Attorney, Agent, or Firm—McDermott Will & Emery LLP

(57) ABSTRACT

Immediately after a Si/SiGe film containing a contaminant is formed over all surfaces of a substrate by epitaxial growth, a portion of the Si/SiGe film formed to the back surface side of the substrate is removed by wet etching. In addition, the Si/SiGe film is subjected to processing with heating in a container, after which a dummy run is carried out in the container. These processings prevent secondary wafer contamination through a stage, a robot arm or a vacuum wand for handling a wafer and the contamination of the container also used in the fabrication process of a semiconductor device free from any group IV element but Si.

13 Claims, 8 Drawing Sheets

METHOD FOR FABRICATING SEMICONDUCTOR DEVICE

BACKGROUND OF THE INVENTION

The present invention relates to methods for fabricating a semiconductor device, and particularly to methods for fabricating a semiconductor device which includes a semiconductor layer containing silicon (Si) and a group IV element other than Si (referred hereinafter to as a contaminant).

With recent progress in performance enhancement and size reduction of mobile communication devices, transistors mounted in a semiconductor device are required to provide high-frequency operation in a higher frequency band and high-speed operation with lower power consumption. As a solution capable of satisfying such requirements, for example, a conventional method of fabricating a semiconductor device with a heterojunction bipolar transistor as described below is known.

FIGS. 5A through 8B are sectional views illustrating process steps in an exemplary conventional method of fabricating a semiconductor device having a heterojunction bipolar transistor.

First, in the step shown in FIG. 5A, a p-type semiconductor substrate 200 is prepared which is made of single crystal silicon whose principal plane is the (100) plane having a resistivity of 10 to 15 Ω·cm, for example. The semiconductor substrate 200 is subjected to ion implantation using a resist film (not shown) as an implantation mask, and thus an n-type buried layer 201 is formed in a bipolar-transistor formation region of the semiconductor substrate 200. After the removal of the resist film and the heat treatment for the substrate, a silicon crystal layer is epitaxially grown to form an n-type epitaxial layer 202 on the main surface side of the substrate.

Next, trenches deeper than the buried layer 201 are formed in regions located at the main surface side of the semiconductor substrate 200 and alongside of the buried layer 201. By thermal oxidation, the surfaces of the deep trenches are oxidized. A polysilicon film 203 is then deposited over all surfaces of the substrate. The resulting polysilicon film 203 is etched back, thereby providing the deep trenches filled with the polysilicon film 203.

In the step shown in FIG. 5B, a resist film 204 having shallow-trench formation regions opened therein is formed, and the semiconductor substrate 200 is etched using this resist film as an etching mask. As a result, shallow trenches 205 are formed to the main surface side of the semiconductor substrate 200.

Subsequently, in the step shown in FIG. 5C, a first silicon oxide film 206 is deposited to the main surface side of the substrate, after which planarization of the deposited film is performed by chemical-mechanical polishing (referred hereinafter to as CMP) or the like. As a result, all the shallow trenches 205 are filled with the first silicon oxide film 206. An N-type dopant is then implanted into the contact portion of the substrate with a metallic collector electrode to form a collector connecting layer 207.

In the step shown in FIG. 5D, a second silicon oxide film 208 is deposited over all surfaces of the substrate, and then a first polysilicon film 209 is deposited on the second silicon oxide film 208. Then, a resist film 210 having an opening therein is formed to the main surface side of the substrate. The second silicon oxide film 208 and the first polysilicon film 209 are patterned by etching using this resist film as a mask, thereby forming a collector opening Aco. In the opening Aco, a base formation region of the bipolar transistor exists.

Next, in the step shown in FIG. 6A, selective epitaxial growth is performed to form a p-type intrinsic base layer 211 containing a SiGe layer and a Si layer on the base formation region. During the growth, p-type polycrystalline Si/SiGe films 212 are also formed to the main and back surface sides of the substrate. When the intrinsic base layer 211 is grown to have a great thickness, the growth selectivity would break down, resulting in the growth of the polycrystalline Si/SiGe film 212 on the silicon oxide film as well. This undesirable growth may lead to the occurrence of particles causing the failure of semiconductor elements. In order to avoid this, the first polysilicon film 209 as a seed layer for the polycrystalline Si/SiGe film 212 is often formed in advance.

Next, in the step shown in FIG. 6B, a third silicon oxide film 213 is deposited over all surfaces of the substrate.

In the step shown in FIG. 6C, a resist film 214 is formed to the main surface side of the substrate, and etching is made using this resist film as a mask such that the third silicon oxide film 213 is allowed to remain on the center portion of the intrinsic base layer 211 and on the Si/SiGe film 212.

In the step shown in FIG. 6D, a p-type polysilicon film 215 is deposited over all surfaces of the substrate, after which a fourth silicon oxide film 216 is deposited on the polysilicon film 215.

In the step shown in FIG. 7A, a resist film 217 is formed to the main surface side of the substrate. By etching using this resist film as a mask, the polysilicon film 215 and the fourth silicon oxide film 216 are patterned. Thus, an emitter opening Aem is formed and the center portion of the third silicon oxide film 213 is exposed at the bottom of the emitter opening Aem.

In the step shown in FIG. 7B, a fifth silicon oxide film 218 is deposited over all surfaces of the substrate, and then an n-type polysilicon film 219, for example, is formed on the fifth silicon oxide film 218. The fifth silicon oxide film 218 and the polysilicon film 219 are etched back. The resulting fifth silicon oxide film 218 and polysilicon film 219 are allowed to remain as side walls on the sides of the emitter opening Aem.

By wet etching, a portion of the third silicon oxide film 213 exposed at the bottom of the emitter opening Aem is removed to expose the center portion of the intrinsic base layer 211. At the time, the Si/SiGe film 212 which is formed on the first polysilicon film 209 is also exposed. Note that the edge of the fifth silicon oxide film 218 is also etched and set back due to this wet etching.

Next, in the step shown in FIG. 7C, an n-type polysilicon film 220 is formed over all surfaces of the substrate, and then the substrate is subjected to heat treatment by rapid thermal annealing (RTA) or the like. The heat treatment diffuses the n-type dopant contained in the polysilicon film 220 into the intrinsic base layer 211, thereby forming an emitter layer 221.

In the step shown in FIG. 8A, a resist film 222 is formed to the main surface side of the substrate. By etching using the resist film 222 as a mask, the polysilicon film 220, the fifth silicon oxide film 218 and the fourth silicon oxide film 216 are patterned, and the resulting polysilicon film 220 is used as an emitter connecting electrode. During this patterning, the first polysilicon film 209 and the Si/SiGe film 212, which are formed on the second silicon oxide film 208, are also patterned, and the resulting first polysilicon film 209 and polysilicon film 215 are used for a base connecting electrode.

Subsequently, in the step shown in FIG. 8B, a sixth silicon oxide film 223 as an interlayer insulating film is deposited to the main surface side of the substrate, after which the surface of the sixth silicon oxide film 223 is planarized by CMP or the like. Contact holes are then formed in portions of the sixth silicon oxide film 223 by photolithography and etching. Finally, a film made of an aluminum alloy (an Al alloy film) is deposited by sputtering in the contact holes and on the sixth silicon oxide film 233 and the sputtered Al alloy film is patterned by photolithography and etching, thereby forming Al wiring 224.

With the foregoing steps, a semiconductor device including a heterojunction bipolar transistor is obtained. Although not shown in FIGS. 5A through 8B, a CMOS device may be formed on the semiconductor substrate 200 apart from the bipolar transistor.

In a conventional method for fabricating a semiconductor device, a wafer which contains a contaminant, such as germanium (Ge), adversely affecting the characteristics of a Si device is generally processed separately from a wafer containing no contaminant by providing a dedicated fabrication line. This separate process is very common in fabricating a semiconductor device such as a DRAM. More specifically, the device fabrication is broadly separated into: the process steps free from contamination (master process); the process steps using tungsten silicide or the like which causes a middle level of contamination damage (siliciding process); and the process steps using aluminum, copper or the like which causes a high level of contamination damage (interconnecting process). In each process, dedicated semiconductor fabrication equipment processes the wafer.

The formation of such fabrication lines is made implementable by the fact that a high volume of semiconductor devices are manufactured using such fabrication lines and therefore a high rate of operation of the semiconductor fabrication equipment can be set. With the conventional semiconductor-device fabrication lines, however, no device fabrication has been made by processing wafers containing a contaminant and wafers containing no contaminant while sharing almost all fabrication equipment in a common fabrication line. The reason for this is to avoid the deterioration in the performance of the fabricated semiconductor device due to contamination.

Heterojunction devices including a Si/SiGe heterojunction (hereinafter, referred simply to as "SiGe devices") can function as semiconductor devices with a high performance owing to germanium contained therein. Since germanium is a contaminant for CMOS devices, however, it is necessary to build a dedicated line for the fabrication of the SiGe devices, as described above. If the dedicated line for the SiGe devices is not provided, the quality of gate oxide films of the fabricated devices or the reliability of the fabricated devices may be deteriorated. For example, where a 20 nm-thick gate oxide film is formed on each wafer and Qbd (charge to breakdown) at which the cumulative failure rate for the wafer is 50% is measured, the wafer forcedly contaminated with germanium (Ge content: 2.5 to $8 \times 10^{12}$ atoms/cm$^2$) has a Qbd of 0.2 to 0.9 C/cm$^2$. This value is remarkably smaller than that of the wafer free from contamination, that is, 2.0 to 3.0 C/cm$^2$ (Ge content: less than $1 \times 10^9$ atoms/cm$^2$, which is the sensitivity limit). It is found from these values that the contaminated wafer has a poor breakdown voltage.

However, provision of a dedicated fabrication line to fabricate SiGe devices without adversely affecting Si devices would bring many cost disadvantages for products fabricated in large item small volume production, which is impractical.

Moreover, SiGe devices are generally fabricated in a fabrication line one or more generation older than CMOS devices. The reason for this is as follows. Very expensive fabrication equipment is used in the fabrication line requiring the cutting edge of fine patterning, so that a high depreciation cost would be required for that equipment. This restricts the use of the fabrication line only to the fabrication of CMOS devices which would promise a high operation rate. On the contrary, the fabrication of SiGe devices in such a cutting-edge line would be a large economic burden because it is unlikely to promise a high operation rate. For this reason, mass-production SiGe devices lag behind CMOS devices in performance enhancement by fine patterning.

As is apparent from the above, in fabricating a SiGe device in an existing fabrication line shared with the fabrication of other devices such as a CMOS device, there exist the following problems. Specifically, in the conventional fabrication step of a semiconductor device shown in FIG. 6A, if the p-type intrinsic base layer 211, which is formed by selective epitaxial growth, contains a contaminant such as germanium, the p-type Si/SiGe film 212 formed to the back surface side of the substrate also contains germanium as a contaminant. When, in the wafer of the structure shown in FIG. 6A, the thickness of the epitaxial growth layer is measured or the wafer is checked by a microscope, germanium contained in the film 212 may be a source of contamination and adhere to another wafer through a stage, robot arm, vacuum wand and the like of the measurement equipment or the check equipment. As a result, germanium adhered to that wafer may cause subsequent contamination (referred hereinafter to as "secondary contamination").

Furthermore, in the case where the third silicon oxide film 213 is formed by LP-CVD in the step shown in FIG. 6B or in the case where the n-type polysilicon film 220 is formed by LP-CVD in the step shown in FIG. 7C, secondary contamination may occur through a tube, boat and wafer loader in a furnace.

Likewise, in the case where the silicon oxide film 213 is subjected to wet etching in the step shown in FIG. 7B, or in the case where the p-type Si/SiGe film 212 to the main surface side of the semiconductor substrate is subjected to dry etching in the step shown in FIG. 8A, secondary contamination may occur through an etching bath, chamber, wafer loader and the like.

SUMMARY OF THE INVENTION

It is an object of the present invention to prevent, in the process steps of fabricating a semiconductor device which contains as a contaminant a group IV element other than Si, such as Ge, the contamination of elements of the semiconductor device and secondary contamination.

A first method for fabricating a semiconductor device of the present invention is to fabricate a semiconductor device including a semiconductor layer containing Si and a group IV element other than Si, and comprises the steps of: (a) forming the semiconductor layer over all surfaces of a substrate; and (b) removing, after the step (a), a portion of the semiconductor layer located to the back surface side of the substrate.

With this method, a portion of the semiconductor layer formed to the back surface side of the substrate and containing a contaminant is removed by etching. This prevents secondary wafer contamination through a stage, robot arm, vacuum wand and the like in subsequent steps. As a result, more fabrication process steps which would cause contamination in conventional methods can be shared with the fabrication process steps of a semiconductor device containing no contaminant, thereby avoiding the increase in fabrication cost.

The step (b) is carried out by wet etching using a mixed solution containing hydrofluoric acid and nitric acid. This makes it possible to remove only the portion of the semiconductor layer located to the back surface side of the substrate while leaving the portion of the semiconductor layer located to the main surface side thereof.

In the step (a), a layer at least partially including a $Si_{1-x-y}Ge_xC_y$ layer ($0 \leq x \leq 1$, $0 \leq y \leq 1$, $x+y>0$) is formed as the semiconductor layer. This provides a fabrication method suitable for the fabrication of a Si/SiGe heterojunction semiconductor device, a Si/SiGeC heterojunction semiconductor device, and a Si/SiC heterojunction semiconductor device.

In the step (a), the $Si_{1-x-y}Ge_xC_y$ layer and a Si layer are sequentially stacked to form a stacked film as the semiconductor layer. This makes it possible to carry out subsequent steps while keeping the region of the stacked film at which the $Si_{1-x-y}Ge_xC_y$ layer containing a contaminant is exposed as small as possible.

The first method further comprises the steps of: processing, after the step (b), the semiconductor layer with heating in a container; and carrying out a dummy run in the container after the process with heating. This makes it possible to surely avoid the adverse effect on a semiconductor device containing no contaminant even when the container is also used in the fabrication process of the semiconductor device containing no contaminant.

A second method for fabricating a semiconductor device of the present invention is to fabricate a semiconductor device including a semiconductor layer containing Si and a group IV element other than Si, and comprises the steps of: (a) forming the semiconductor layer over all surfaces of a substrate; (b) processing, after the step (a), the semiconductor layer with heating in a container used in part of the process of fabricating a semiconductor device containing Si and not containing any group IV element but Si; and (c) carrying out a dummy run in the container after the step (b).

This method surely avoids the adverse effect of secondary contamination on a semiconductor device containing no contaminant even when the container is also used in the fabrication process of the semiconductor device containing no contaminant.

The step (b) is carried out at a higher temperature than the step (a). This may provide a higher possibility of contaminating the inside of the container because during the step (b), the contaminant contained in the semiconductor layer is easy to diffuse outward. Even in this case, however, a dummy run carried out before the step (b) of processing the semiconductor layer with heating surely avoids the adverse effect on a semiconductor device containing no contaminant.

The container generally corresponds to either one of a chamber and a tube for use in deposition of the film or heat treatment of the substrate.

The step (c) is preferably carried out in the state in which a dummy wafer is placed in the container.

The second method further comprises the step of performing, after the step (c), element analysis for the dummy wafer or a film deposited on the dummy wafer to determine whether or not a group IV element other than Si exists. This makes it possible to manage the fabrication process of a semiconductor device smoothly.

Preferably, in the step (a), a layer at least partially including a $Si_{1-x-y}Ge_xC_y$ layer ($0 \leq x \leq 1$, $0 \leq y \leq 1$, $x+y>0$) is formed as the semiconductor layer.

The first and second methods further comprise the steps of: forming wiring after the step (b); and patterning the semiconductor layer just before the wiring formation step. This makes it possible to suppress the diffusion of a contaminant in the steps having a potential for suffering great contamination damage as narrowly as possible.

The first and second methods further comprise the steps of forming a silicide layer on part of the semiconductor layer after the step (b); and patterning the semiconductor layer just before the silicide-layer formation step. This makes it possible to suppress the diffusion of a contaminant in the steps having a potential for suffering not a little contamination damage as narrowly as possible.

BRIEF DESCRIPTION OF THE PREFERRED DRAWINGS

DESCRIPTION OF THE PREFERRED EMBODIMENTS

FIGS. 1A through 4C are cross-sectional views showing process steps in a method of fabricating a semiconductor device according to an embodiment of the present invention.

Figure 1A:
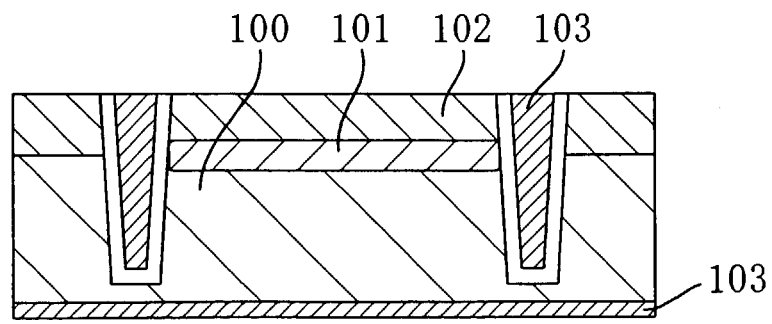
FIGS. 1A through 1D are cross-sectional views showing process steps in a method of fabricating a semiconductor device according to an embodiment of the present invention, in which the process steps between the beginning and the collector-opening formation step are illustrated.

First, in the step shown in FIG. 1A, a p-type semiconductor substrate 100 is prepared which is made of single crystal silicon whose principal plane is the (100) plane having a resistivity of 10 to 15 Ω·cm, for example. The semiconductor substrate 100 is subjected to ion implantation using a resist film (not shown) as an implantation mask, and thus an n-type buried layer 101 is formed in a bipolar-transistor formation region of the semiconductor substrate 100. After the removal of the resist film and the heat treatment for the substrate, a silicon crystal layer is epitaxially grown to form an n-type epitaxial layer 102 on the main surface side of the substrate.

Next, trenches deeper than the buried layer 101 are formed in regions located at the main surface side of the semiconductor substrate 100 and alongside of the buried layer 101. By thermal oxidation, the surface of the deep trench is oxidized. A polysilicon film 103 is then deposited over all surfaces of the substrate. The resulting polysilicon film 103 is etched back, thereby providing the deep trenches filled with the polysilicon film 103.

Figure 1B:
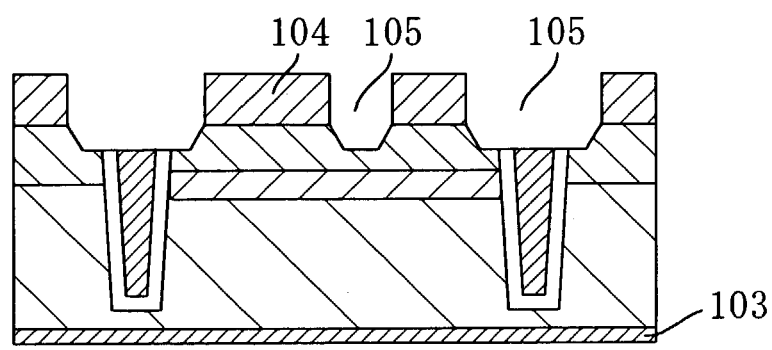

In the step shown in FIG. 1B, a resist film 104 having shallow-trench formation regions opened therein is formed, and the semiconductor substrate 100 is etched using this resist film as an etching mask. As a result, shallow trenches 105 are formed to the main surface side of the semiconductor substrate 100.

Figure 1C:
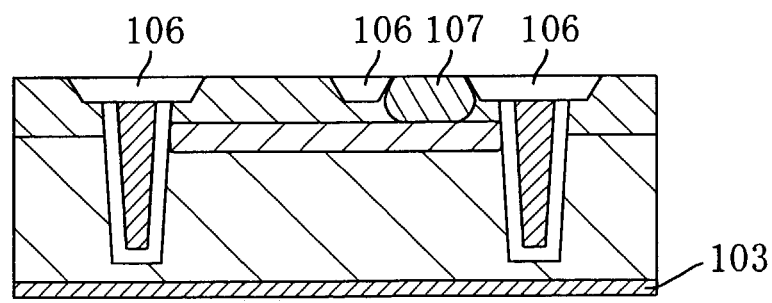

Subsequently, in the step shown in FIG. 1C, a first silicon oxide film 106 is deposited to the main surface side of the substrate, after which planarization of the deposited film is performed by CMP or the like. As a result, all the shallow trenches 105 are filled with the first silicon oxide film 106. An N-type dopant is then implanted into the contact portion of the substrate with a metallic collector electrode to form a collector connecting layer 107.

Figure 1D:
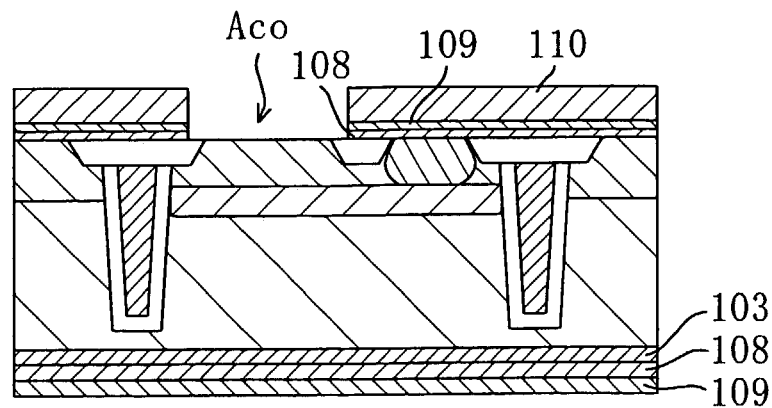

In the step shown in FIG. 1D, a second silicon oxide film 108 is deposited over all surfaces of the substrate, and then a first polysilicon film 109 is deposited on the second silicon oxide film 108. Then, a resist film 110 having an opening therein is formed to the main surface side of the substrate. The second silicon oxide film 108 and the first polysilicon film 109 are patterned by etching using this resist film as a mask, thereby forming a collector opening Aco. In the opening Aco, a base formation region of the bipolar transistor exists.

Figure 2A:
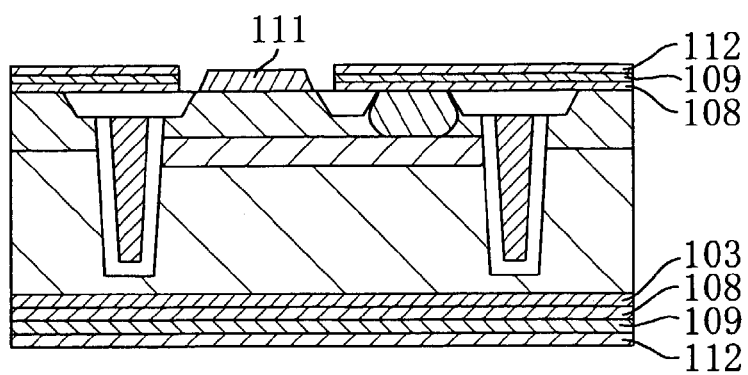
FIGS. 2A through 2D are cross-sectional views showing process steps in the method of fabricating a semiconductor device according to the embodiment of the present invention, in which the process steps between the base-layer epitaxial growth step and the fourth-silicon-oxide-film formation step are illustrated.

Next, in the step shown in FIG. 2A, selective epitaxial growth is performed to form a p-type intrinsic base layer 111 containing a SiGe layer and a Si layer on the base formation region. During the growth, p-type polycrystalline Si/SiGe films 112 are also formed to the main and back surface sides of the substrate. The first polysilicon film 109 is not necessarily required for this selective epitaxial growth of the intrinsic base layer 111. However, when the intrinsic base layer 111 is grown to have a great thickness, the growth selectivity would break down, resulting in the growth of the polycrystalline Si/SiGe film 112 on the silicon oxide film as well. This undesirable growth may lead to the occurrence of particles causing the failure of semiconductor elements. In order to avoid this, the first polysilicon film 109 as a seed layer for the polycrystalline Si/SiGe film 112 is formed in advance.

A characteristic of the method for fabricating a semiconductor device according to the present embodiment is to remove, immediately after the step shown in FIG. 2A, the p-type Si/SiGe film 112 which contains a contaminant and which is formed on the first polysilicon film 109 provided to the back surface side of the semiconductor substrate 100. This removal is performed by backside wet etching.

In an exemplary process of the removal, a mixed solution of hydrofluoric acid (HF) and nitric acid ($HNO_3$) (HF:$HNO_3$=1:6) is employed as a chemical solution for the backside wet etching. In this process, there is apprehension that secondary contamination of a wafer to be subsequently processed occurs due to the circulating chemical solution. However, the use of the mixed solution of HF and $HNO_3$ (HF:$HNO_3$=1:6) prevents the secondary contamination even when the concentration of Ge contained in the circulating solution is about 42 ppm. In addition, a silicon nitride film may be employed in the step of defining an active region of a bipolar transistor, and the employed silicon nitride film may further be employed as an etch stopper in the wet etching step.

Figure 2B:
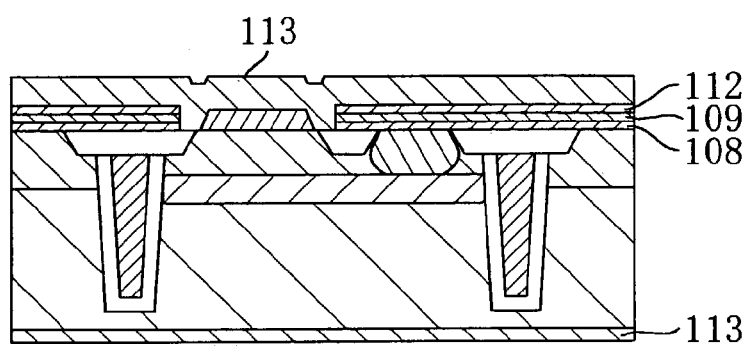

Next, in the step shown in FIG. 2B, a third silicon oxide film 113 is deposited over all surfaces of the substrate. Immediately after the formation of the third silicon oxide film 113 in this step, the dummy run step is carried out using the tube, chamber or the like in the semiconductor fabrication equipment in which the third silicon oxide film 113 has been deposited. Herein, "the dummy run step" means that the deposition of a dummy film or the heat treatment for a substrate is performed in the state in which no wafer or a dummy wafer (a dummy substrate) is placed inside the tube or chamber in the semiconductor fabrication equipment.

Figure 2C:
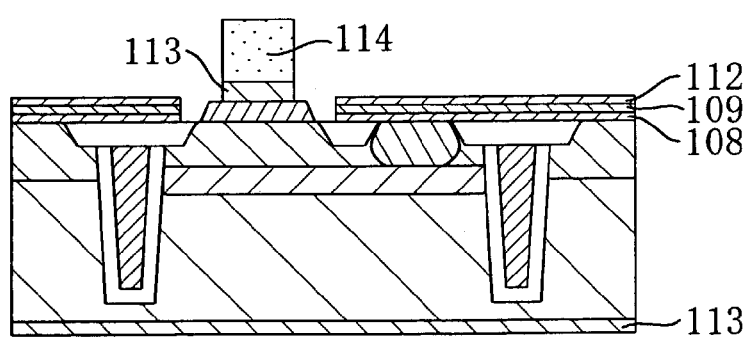

In the step shown in FIG. 2C, a resist film 114 is formed to the main surface side of the substrate, and etching is made using this resist film as a mask such that the third silicon oxide film 113 is allowed to remain on the center portion of the intrinsic base layer 111 and on the Si/SiGe film 112.

Figure 2D:
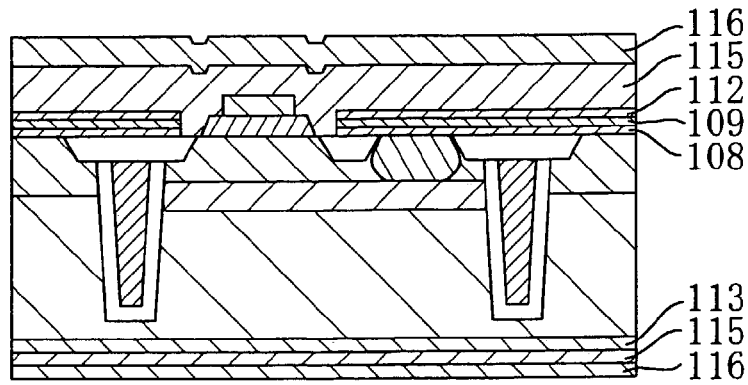

In the step shown in FIG. 2D, a p-type polysilicon film 115 is deposited over all surfaces of the substrate, after which a fourth silicon oxide film 116 is deposited on the polysilicon film 115.

Figure 3A:
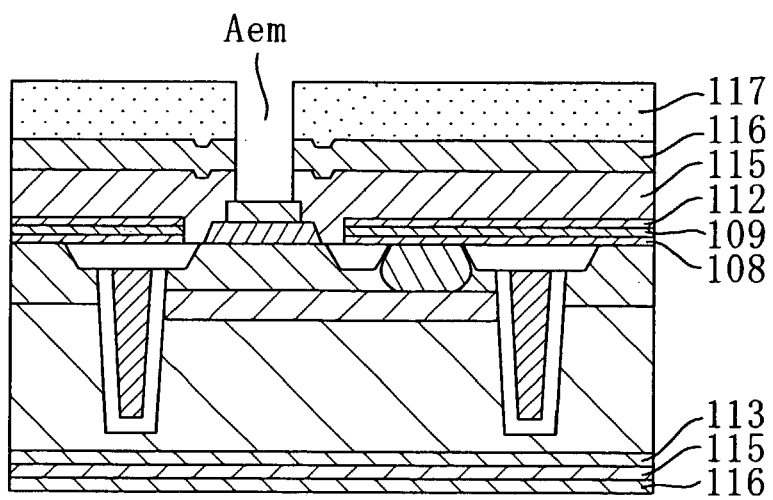
FIGS. 3A through 3C are cross-sectional views showing process steps in the method of fabricating a semiconductor device according to the embodiment of the present invention, in which the process steps between the emitter-opening formation step and the step of doping into an emitter layer are illustrated.

In the step shown in FIG. 3A, a resist film 117 is formed to the main surface side of the substrate. By etching using this resist film as a mask, the polysilicon film 115 and the fourth silicon oxide film 116 are patterned. Thus, an emitter opening Aem is formed and the center portion of the third silicon oxide film 113 is exposed at the bottom of the emitter opening Aem.

Figure 3B:
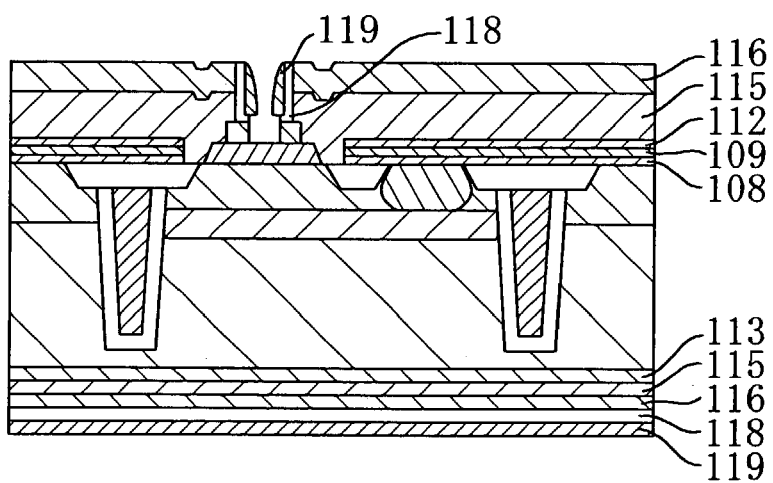

In the step shown in FIG. 3B, a fifth silicon oxide film 118 is deposited over all surfaces of the substrate, and then an n-type polysilicon film 119, for example, is formed on the fifth silicon oxide film 118. The fifth silicon oxide film 118 and the polysilicon film 119 are etched back. The resulting fifth silicon oxide film 118 and polysilicon film 119 are allowed to remain as side walls on the sides of the emitter opening Aem.

By wet etching, a portion of the third silicon oxide film 113 exposed at the bottom of the emitter opening Aem is removed to expose the center portion of the intrinsic base layer 111. Note that the edge of the fifth silicon oxide film 118 is also etched and set back due to this wet etching.

Figure 3C:
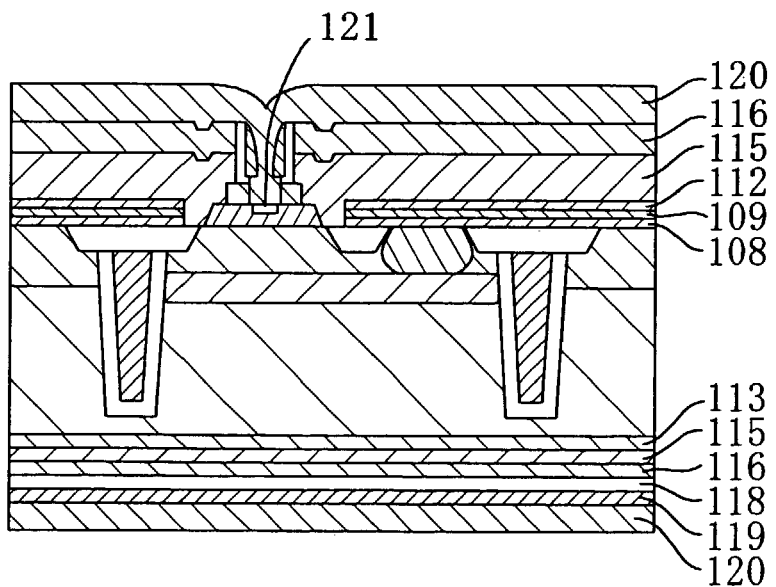

Next, in the step shown in FIG. 3C, an n-type polysilicon film 120 is formed over all surfaces of the substrate, and then the substrate is subjected to heat treatment by rapid thermal annealing (RTA) or the like. The heat treatment diffuses the n-type dopant contained in the polysilicon film 120 into the intrinsic base layer 111, thereby forming an emitter layer 121.

Figure 4A:
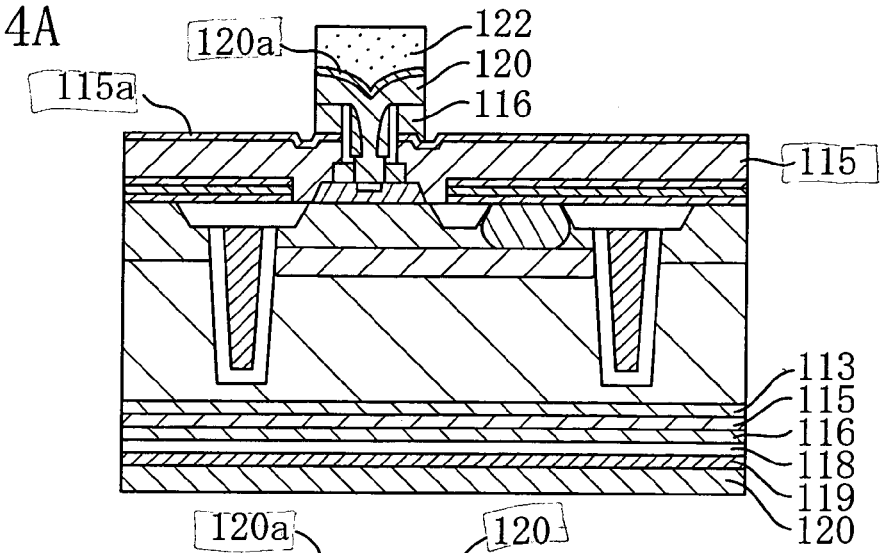
FIGS. 4A through 4C are cross-sectional views showing process steps in the method of fabricating a semiconductor device according to the embodiment of the present invention, in which the process steps between the emitter-connecting-electrode formation step and the wiring formation step are illustrated.

In the step shown in FIG. 4A, a resist film 122 is formed to the main surface side of the substrate. By etching using the resist film 122 as a mask, the polysilicon film 120, the fifth silicon oxide film 118 and the fourth silicon oxide film 116 are patterned, and the resulting polysilicon film 120 is used for an emitter connecting electrode.

Subsequently, in the step shown in FIG. 4B, the resist film 122 is removed, after which another resist film 123 is formed to the main surface side of the substrate. By etching using the resist film as a mask, the polysilicon film 115, the Si/SiGe film 112 and the first polysilicon film 109 are simultaneously patterned, and the resulting first polysilicon film 109, Si/SiGe film 112, and polysilicon film 115 are used for a base connecting electrode. That is to say, just before the interconnection step having a relatively high acceptable level of contamination, the polysilicon film 115, the Si/SiGe film 112 containing the contaminant and the polysilicon film 109 are dry-etched at a time.

Subsequently, in the step shown in FIG. 4C, a sixth silicon oxide film 124 as an interlayer insulating film is deposited to the main surface side of the substrate, and then the surface of the sixth silicon oxide film 124 is planarized by chemical-mechanical polishing (CMP) or the like. Contact holes are then formed in portions of the sixth silicon oxide film 124 by photolithography and etching. Finally, an Al alloy film is deposited by sputtering in the contact holes and on the sixth silicon oxide film 124, after which the sputtered Al alloy film is patterned by photolithography and etching, thereby forming Al wiring 125 including plugs.

With the foregoing steps, a semiconductor device including a heterojunction bipolar transistor is obtained. Although not shown in FIGS. 1A through 4C, a CMOS device may be formed on the semiconductor substrate 100 apart from the bipolar transistor.

Effects of the Present Embodiment

According to the present embodiment, immediately after the intrinsic base layer 111 containing the contaminant is formed by epitaxial growth in the step shown in FIG. 2A, the Si/SiGe film 112 which contains the contaminant and which is formed on the first polysilicon film 109 provided to the back surface side of the semiconductor substrate 100 is removed by backside wet etching. This makes it possible to prevent secondary contamination through a stage, robot arm, vacuum wand and the like. Accordingly, more pieces of fabrication equipment which would cause contamination in conventional methods can be shared between the wafer containing a contaminant and the wafer containing no contaminant, thereby avoiding the increase in fabrication cost.

Also, according to the present embodiment, immediately after the third silicon oxide film 113 is formed in the step shown in FIG. 2B, the dummy run step is carried out. This makes it possible to prevent secondary contamination caused by the contaminant occurring from the intrinsic base layer 111 or the Si/SiGe film 112 through the furnace.

In addition, a monitoring wafer used in the dummy run step is checked by elemental analysis to determine whether the wafer is contaminated or not, and the analyzed result is used as an index of process control. Thus, contamination can be managed with higher reliability. Moreover, the analyzed data is stored for every type of device or every process condition. Through the use of these items of data, variation in device performance can be reduced and production yield can be improved.

Analysis for Determining Effect of Dummy Run

Herein, description will be made of the result of an analytical experiment for determining the effect of a dummy run immediately after the step shown in FIG. 2A. In this experiment, the effect has been determined using a 20 nm-thick LP-TEOS film deposited by CVD at 680° C. (a film mainly made of tetraethylorthosilicate and deposited by LP-CVD method).

A TEOS film is deposited at the same time both on a monitoring wafer and on an 8-inch silicon wafer on all surfaces of which a SiGe film with a germanium content of 15% is grown. The resulting monitoring wafer is used as a first sample. After the deposition of the TEOS film, a dummy run is carried out and then a TEOS film is deposited again on a second monitoring wafer. The resulting second monitoring wafer is used as a second sample.

For each of the first and second samples, the TEOS film on the sample surface was dissolved and elemental analysis was conducted by an inductive coupled plasma mass spectrometry system. As a result of the analysis, in the first sample, germanium with a density of $2 \times 10^{12}$ atoms/cm$^2$ was detected on the surface thereof. However, in the second sample, no germanium was detected. It was found from the result of the second sample that the second sample contained germanium at only $1 \times 10^9$ atoms/cm$^2$ or less, which is the sensitivity limit of the inductive coupled plasma spectrometry system having a quadrupol mass spectrometer. Thus, it has been shown that the dummy run step can prevent germanium contamination.

Accordingly, after a wafer at the surface of which a film containing a contaminant such as germanium is exposed is processed by a certain piece of fabrication equipment, a subsequent wafer to be processed in this equipment is not processed until a dummy run of this equipment is completed. This prevents secondary contamination effectively. Particularly, in cases where, like the present embodiment, after the deposition of a SiGe film, a TEOS film is deposited by CVD at a higher temperature (about 680° C.) than the temperature of the epitaxial growth of a SiGe film (about 550 to 600° C.), germanium in the SiGe film is easy to diffuse outward during the CVD. Therefore, the furnace of the LP-CVD equipment used has an increased possibility of contamination. Consequently, the dummy run step is preferably carried out after the growth of a SiGe film and before the deposition of an oxide film such as a TEOS film or a nitride film.

Moreover, specializing a recipe according to the wafer to be processed in a certain piece of equipment is very effective means for avoiding mistakes in processing.

In addition, provided that germanium contamination is caused to the semiconductor fabrication equipment due to the process of a semiconductor substrate containing germanium, for example, in that equipment. Even in this case, it has been confirmed that gas cleaning with $CHF_3$ or the like or the cleaning of a tube can remove the contaminant in the semiconductor fabrication equipment to recover the equipment. Herein, the recovery of the equipment means the condition that when the monitoring wafer processed in that equipment is analyzed by an inductive coupled plasma spectrometry system having a quadrupol mass spectrometer, the density of germanium contained in the wafer is less than $1 \times 10^9$ atoms/cm$^2$, which is the sensitivity limit of the system, in other words, no germanium is detected for the analysis by the system.

For analysis equipment, an inductive coupled plasma mass spectrometry system having a double-focusing mass spectrometer is preferably employed. This is because the double-focusing mass spectrometry has a high resolution and therefore it is less sensitive to spectral interference resulting from a matrix. In order to recover a solution for analysis, an acid recovery solution such as hydrofluoric acid or a mixed solution of hydrofluoric acid and nitric acid can be used to dissolve the surface of a deposited film or a semiconductor substrate. Moreover, determination about the effect of the dummy run is preferably made by using the solubility and the diffusion constant of a contaminant as indices.

A monitoring wafer used in the dummy run step is preferably placed at the upper, center and lower points of a tube in order to check the entire tube for contamination. To measure the amount of contamination of a wafer in processing the wafer and a semiconductor substrate with a contaminant at a time, a monitoring wafer, together with semiconductor substrates which contain the contaminant and which interpose the monitoring wafer therebetween, may be placed in the tube. From this monitoring wafer, the amount of contamination can be measured.

Moreover, the analysis result of the monitoring wafer may be used as a source for determining whether or not a subsequent wafer to be processed, such as a CMOS device, can be processed in the equipment of interest.

Other Effects of the Present Embodiment

Figure 4B:
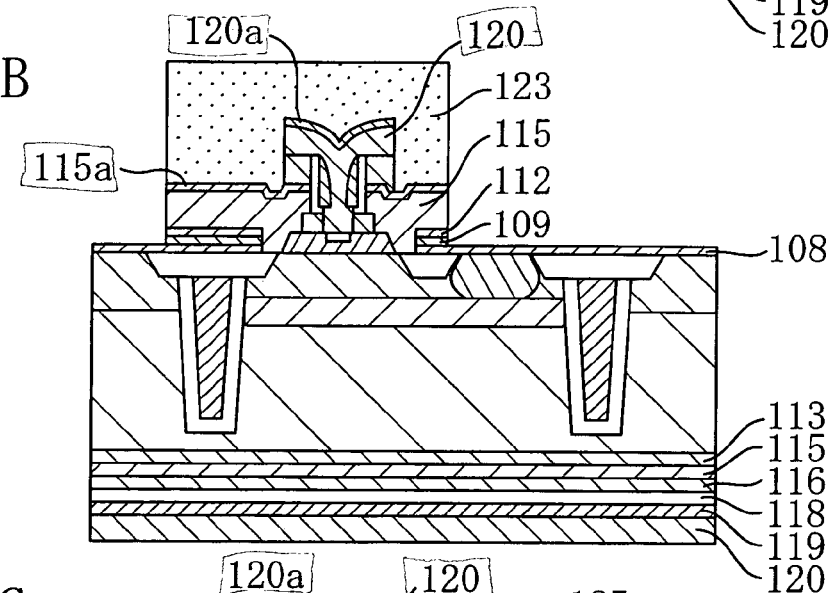

According to the present embodiment, in the step shown in FIG. 4B, the polysilicon film 115, the Si/SiGe film 112 containing the contaminant and the first polysilicon film 109 are simultaneously dry-etched. Thus, such a film as contains a contaminant is etched just before the interconnection process causing a relatively high level of contamination damage, so that secondary contamination in the master process can be prevented.

In the case where, before the interconnection process, a silicides 120a, 115a are formed on the n-type polysilicon film 120 as an emitter electrode and on the p-type polysilicon film 115 as a connecting electrode to reduce contact resistance of the electrodes with metal wiring, the p-type Si/SiGe film 112 containing the contaminant is etched immediately before the silicide process not causing a lower level of contamination damage, so that secondary contamination in the master process can be prevented.

As is apparent from the above, the method for fabricating a semiconductor device according to the present embodiment is very effective in fabricating a silicon-based heterostructure device mainly made of silicon in a silicon-device fabrication line for fabricating a CMOS logic device including an MIS transistor and the like.

OTHER EMBODIMENTS

In the above embodiment, description has been made of a heterojunction bipolar transistor, in particular an NPN transistor, as an example. Alternatively, the present invention is also applicable to a PNP transistor or a heterojunction MIS transistor.

Moreover, the present invention is also applicable to a device embedded therein with a heterojunction bipolar transistor and a SiMIS transistor, and to a device embedded with a heterojunction bipolar transistor and a MIS transistor having a Si/SiGe heterojunction.

The present invention is applied to a semiconductor device containing a contaminant in a device other than the bipolar transistor, so that the effect described in the above embodiment can be exerted. In a bipolar transistor, for example, a p-type intrinsic base may be made of Si.

In the above embodiment, a semiconductor device including a SiGeC base layer or a SiC base layer, instead of the SiGe base layer, can also exert the effects of the present invention. That is to say, the present invention is applicable to all semiconductor devices including a $Si_{1-x-y}Ge_xC_y$ layer ($0 \leq x \leq 1$, $0 \leq y \leq 1$, x+y>0).

In the above embodiment, a semiconductor substrate having an epitaxial layer which has already contained a contaminant (for a bipolar transistor, the layer is used as a collector layer) may be employed as a semiconductor substrate.

In the above embodiment, after the formation of the n-type buried layer 101 in the step show in FIG. 1A, the n-type epitaxial layer 102 is formed by in-situ doping involving a relatively high fabrication cost. The in-situ doping may be replaced with a high energy implantation after the epitaxial growth. This makes it possible to reduce the fabrication cost in the epitaxial growth step.

In the above embodiment, the insulating film made up of a silicon oxide film may be replaced with that made up of a silicon nitride film. Moreover, in the step shown in FIG. 1A, the deep trench is filled with the polysilicon film 103 after the surface of the deep trench is oxidized. The deep trench may be filled with a silicon oxide film instead of the polysilicon film 103.

Figure 4C:
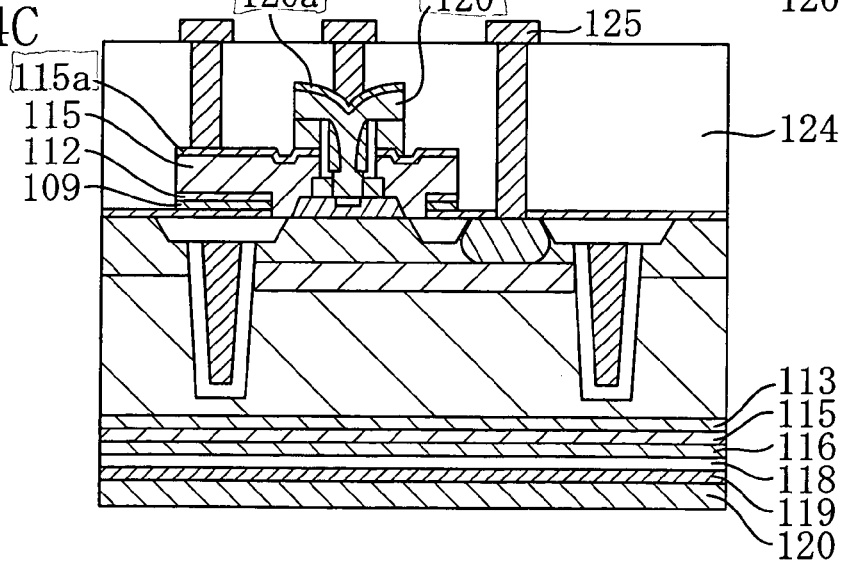
Figure 5A:
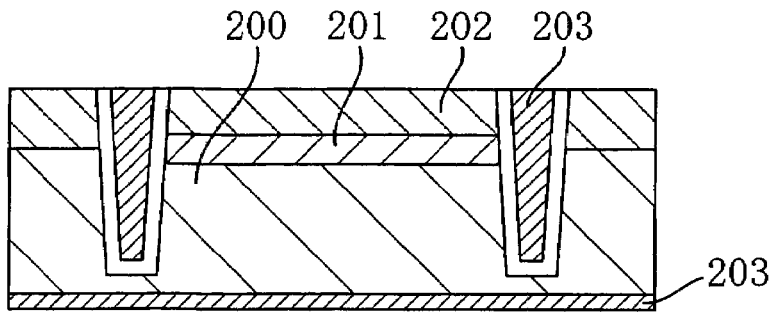
FIGS. 5A through 5D are cross-sectional views showing process steps in a conventional method of fabricating a semiconductor device, in which the process steps between the beginning and the collector-opening formation step are illustrated.
Figure 5B:
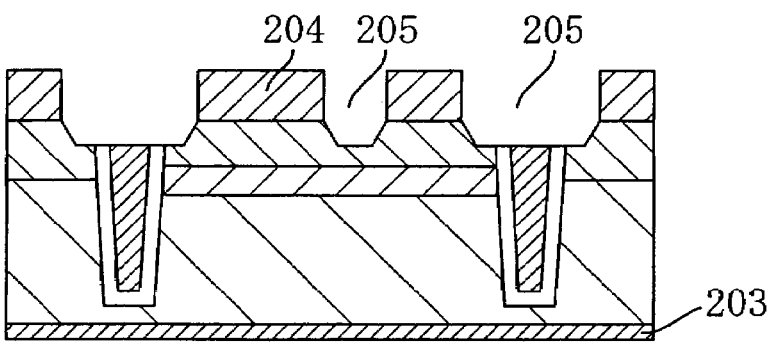
Figure 5C:
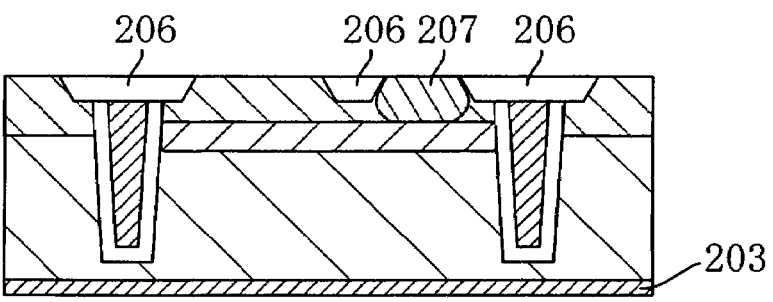
Figure 5D:
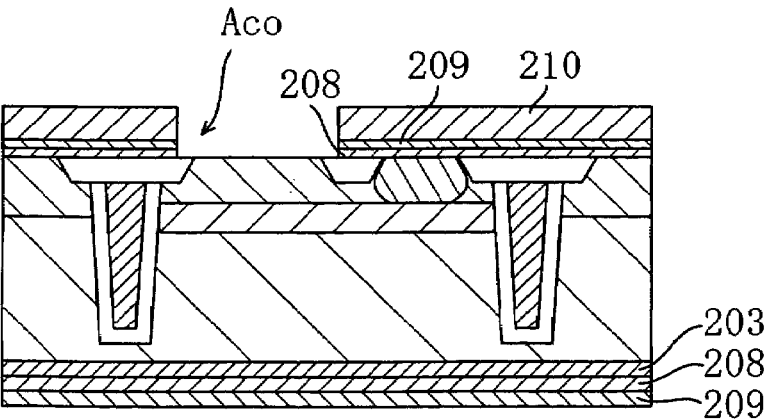
Figure 6A:
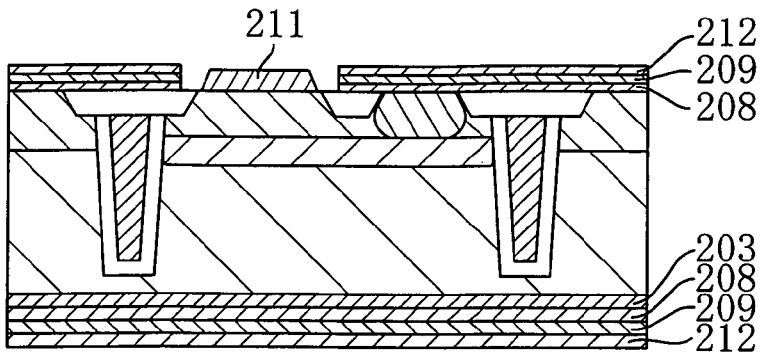
FIGS. 6A through 6D are cross-sectional views showing process steps in the conventional method of fabricating a semiconductor device, in which the process steps between the base-layer epitaxial growth step and the fourth-silicon-oxide-film formation step are illustrated.
Figure 6B:
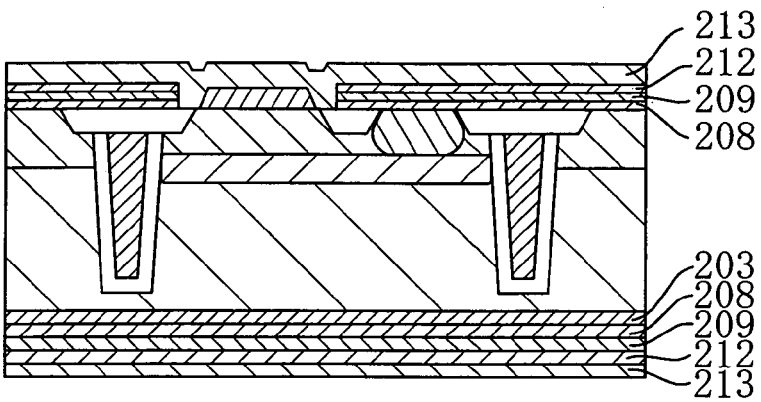
Figure 6C:
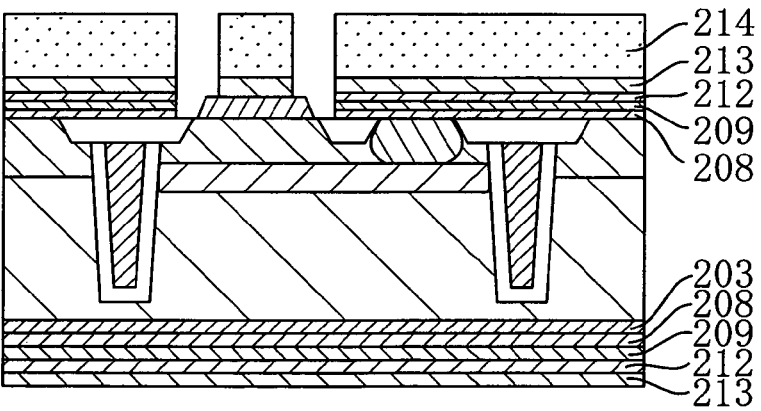
Figure 6D:
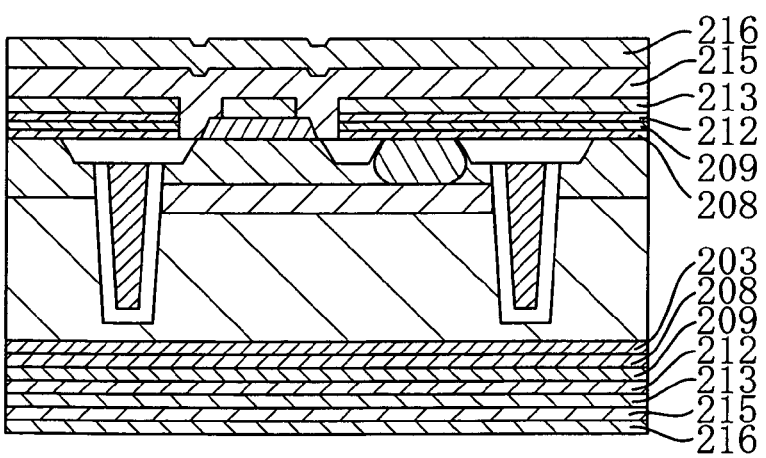
Figure 7A:
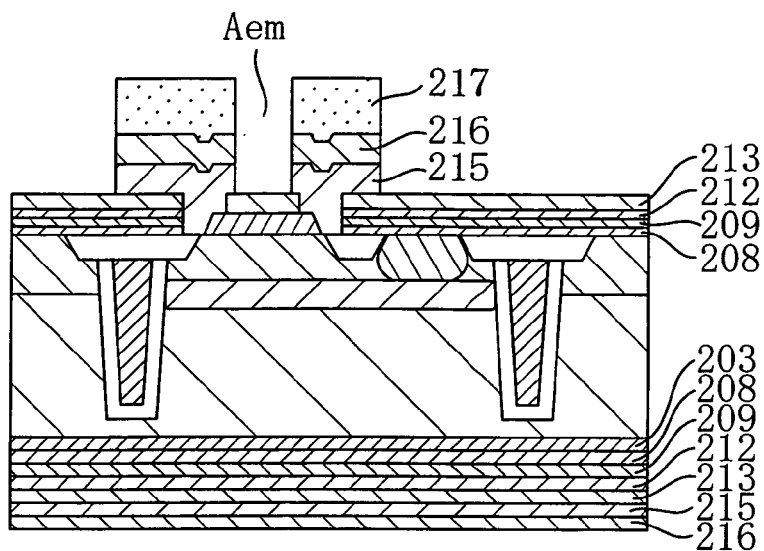
FIGS. 7A through 7C are cross-sectional views showing process steps in the conventional method of fabricating a semiconductor device, in which the process steps between the emitter-opening formation step and the step of doping into an emitter layer are illustrated.
Figure 7B:
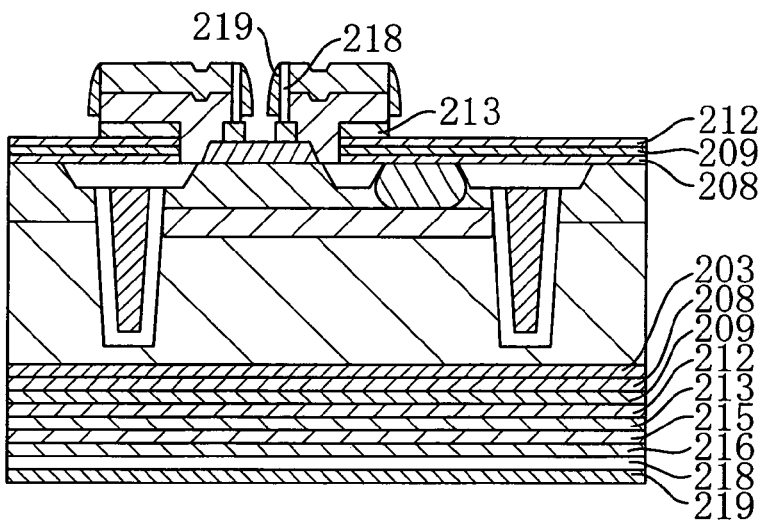
Figure 7C:
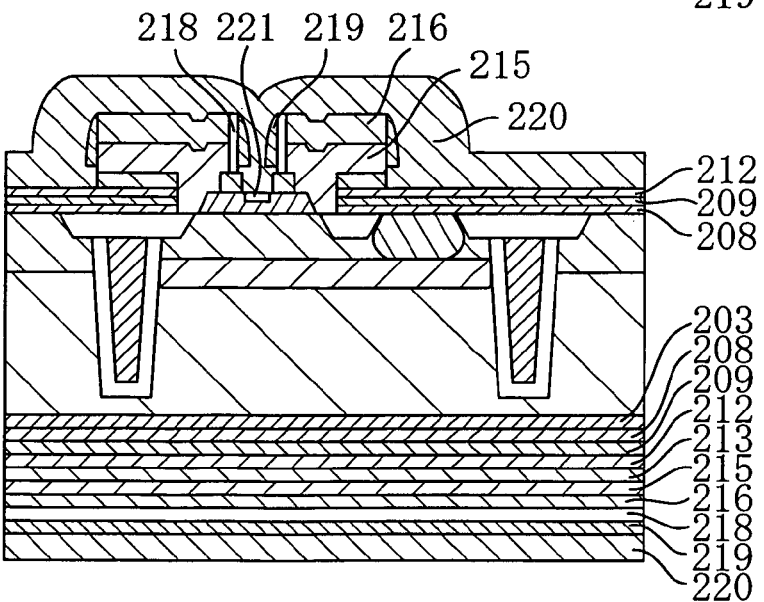
Figure 8A:
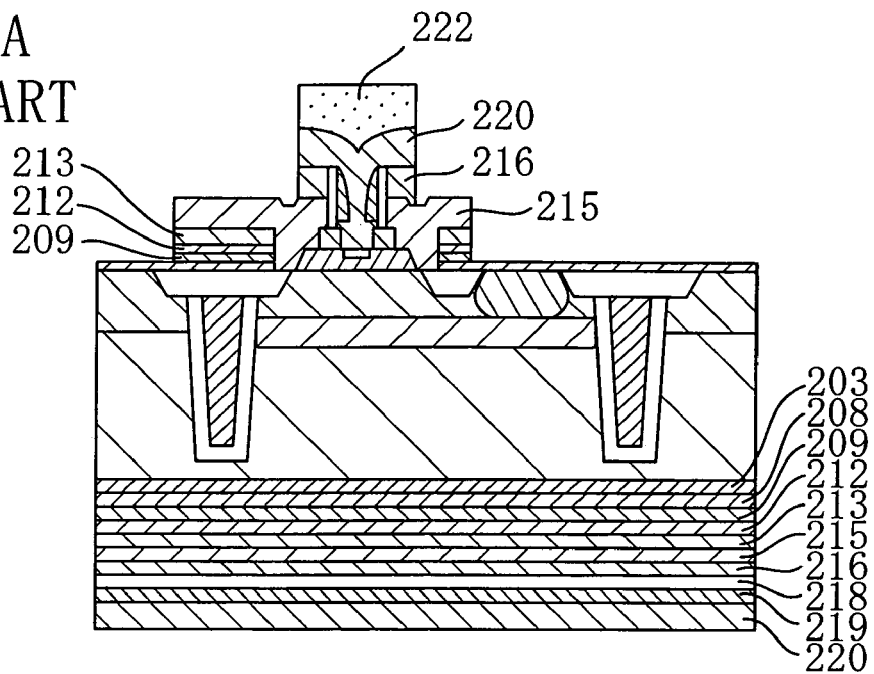
FIGS. 8A and 8B are cross-sectional views showing process steps in the conventional method of fabricating a semiconductor device, in which the process steps between the emitter-connecting-electrode formation step and the wiring formation step are illustrated.
Figure 8B:
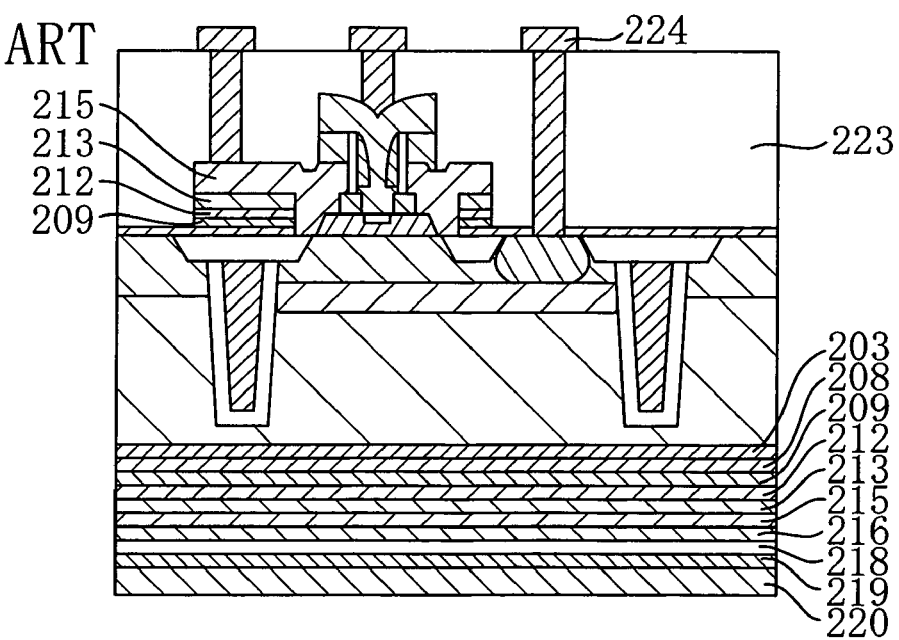

In the step shown in FIG. 4C, CMP is used to planarize the sixth silicon oxide film 124 as an interlayer insulating film. Alternatively, etch back may be employed for planarization. Moreover, a fluid interlayer insulating film (such as a BPSG film) is deposited and then the film is subjected to the reflow step by heat treatment for planarization. Planarization is not necessarily performed.

In the above embodiment, the entire wiring in a broad sense including the plugs is formed of an Al alloy. Alternatively, W plugs and Al wiring in a narrow sense may be used together. Wiring and plugs may also be formed of a metal other than Al, such as Ti or Cu, or an alloy of Ti or Cu.

The processes employed in the above embodiment may be replaced with compatible processes. For example, thermal oxidization can be replaced with CVD in the step of forming an oxide film, dry etching can be replaced with wet etching in the etching step, and vice versa.

What is claimed is:

1. A method for fabricating a semiconductor device with a transistor having a portion of a semiconductor layer containing Si and a group IV element other than Si, the method comprising the steps of:
   (a) forming the semiconductor layer on a main surface and a back surface of a Si substrate; and
   (b) removing, after the step (a), only a portion of the semiconductor layer located on the back surface of the Si substrate.

2. The method of claim 1, wherein the step (b) is carried out by wet etching using a mixed solution containing hydrofluoric acid and nitric acid.

3. The method of claim 1, wherein in the step (a), a layer at least partially including a $Si_{1-x-y}Ge_xC_y$ layer ($0 \leq x < 1$, $0 \leq y < 1$, $0 < x+y < 1$) is formed as the semiconductor layer.

4. The method of claim 3, wherein in the step (a), the $Si_{1-x-y}Ge_xC_y$ layer and a Si layer are sequentially stacked to form a stacked film as the semiconductor layer.

5. The method of claim 1, wherein the semiconductor layer contains at least Ge.

6. The method of claim 1, further comprising the step of doping into the semiconductor layer after the step (b).

7. The method of claim 1, wherein the step (b) includes a sub-step of thoroughly removing the semiconductor layer formed on the back surface side of the Si substrate.

8. The method of claim 1, further comprising a step of at least forming an etching stopper film for a backside wet etching of the semiconductor layer on the back surface of the Si substrate,
wherein the step (b) includes a sub-step of removing the semiconductor layer that is located to the back surface side of the Si substrate and is formed on the etching stopper film by backside wet etching.

9. The method of claim 1, wherein the transistor is a heterojunction bipolar transistor.

10. The method of claim 1, further comprising the step of forming a Si epitaxial layer on the main surface of the Si substrate before the step (a).

11. A method for fabricating a semiconductor device including a semiconductor layer containing Si and a group IV element other than Si, comprising the steps of:
  (a) forming the semiconductor layer over all surfaces of a substrate;
  (b) removing, after the step (a), a portion of the semiconductor layer located to the back surface side of the substrate;
  (c) processing, after the step (b), the semiconductor layer with heating in a container; and
  (d) carrying out a dummy run in the container after the process with heating.

12. A method for fabricating a semiconductor device including a semiconductor layer containing Si and a group IV element other than Si, comprising the steps of:
  (a) forming the semiconductor layer over all surfaces of a substrate;
  (b) removing, after the step (a), only a portion of the semiconductor layer located on the back surface of the substrate;
  (c) forming wiring after the step (b); and
  (d) patterning the semiconductor layer just before the wiring formation step.

13. A method for fabricating a semiconductor device including a semiconductor layer containing Si and a group IV element other than Si, comprising the steps of:
  (a) forming the semiconductor layer over all surfaces of a substrate;
  (b) removing, after the step (a), only a portion of the semiconductor layer located on the back surface of the substrate;
  (c) forming a silicide layer on part of the semiconductor layer after the step (b); and
  (d) patterning the semiconductor layer just before the silicide-layer formation step.

* * * * *